US011928330B2

(12) United States Patent
Qawami et al.

(10) Patent No.: US 11,928,330 B2
(45) Date of Patent: *Mar. 12, 2024

(54) TECHNIQUES TO UPDATE A TRIM PARAMETER IN NON-VOLATILE MEMORY

(71) Applicant: Micron Technology, Inc., Boise, ID (US)

(72) Inventors: Shekoufeh Qawami, El Dorado Hills, CA (US); Doyle W. Rivers, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 212 days.

This patent is subject to a terminal disclaimer.

(21) Appl. No.: 17/518,154

(22) Filed: Nov. 3, 2021

(65) Prior Publication Data

US 2022/0057939 A1 Feb. 24, 2022

Related U.S. Application Data

(63) Continuation of application No. 16/848,608, filed on Apr. 14, 2020, which is a continuation of application No. 15/857,054, filed on Dec. 28, 2017, now Pat. No. 10,649,656.

(51) Int. Cl.
*G06F 3/06* (2006.01)
(52) U.S. Cl.
CPC .......... *G06F 3/0604* (2013.01); *G06F 3/0634* (2013.01); *G06F 3/0679* (2013.01)
(58) Field of Classification Search
CPC ..... G06F 3/0604; G06F 3/0634; G06F 3/0679
See application file for complete search history.

(56) References Cited

U.S. PATENT DOCUMENTS 6,198,668 B1 3/2001 Watts
6,321,142 B1 11/2001 Shutty
(Continued)

FOREIGN PATENT DOCUMENTS

CN 104572481 A 4/2015
JP 2009-110476 A 5/2009
(Continued)

OTHER PUBLICATIONS

European Patent Office, "Extended Search Report," issued in connection with European Patent Application No. 18895115.6, dated Oct. 8, 2021 (8 pages).
(Continued)

*Primary Examiner* — Jae U Yu
(74) *Attorney, Agent, or Firm* — Holland & Hart LLP

(57) ABSTRACT

Techniques to update a trim parameter in non-volatile memory during either a manufacturing stage or a post-manufacturing stage are described. Trim parameters may be stored in a register located within the memory device that is inaccessible by a host device during a normal mode of operation. Post-manufacturing updates to trim parameters by the host device may be feasible by creating registers located within the memory device that are accessible to the host device to provide information regarding trim parameter setting updates. The memory device may read the information from the registers accessible to the host device to update trim parameters stored in the register inaccessible by the host device. In this manner, the host device may not have a direct access to the trim parameters but still be able to provide an update to the trim parameters by updating an entry of the registers accessible by the host device.

20 Claims, 8 Drawing Sheets

(56) References Cited

U.S. PATENT DOCUMENTS

| | | |
|---|---|---|
| 7,302,592 B2 | 11/2007 | Shipton et al. |
| 2007/0223278 A1 | 9/2007 | Aritome |
| 2008/0252505 A1 | 10/2008 | Lee et al. |
| 2010/0107249 A1 | 4/2010 | Krig |
| 2011/0202919 A1 | 8/2011 | Hayakawa et al. |
| 2012/0110249 A1 | 5/2012 | Jeong et al. |
| 2012/0239858 A1 | 9/2012 | Melik-martirosian |
| 2013/0031296 A1* | 1/2013 | Na ............... G11B 27/36 711/E12.007 |
| 2013/0326161 A1 | 12/2013 | Cohen et al. |
| 2014/0003166 A1 | 1/2014 | Kobata |
| 2014/0181426 A1 | 6/2014 | Grunzke |
| 2014/0241097 A1 | 8/2014 | Hawes et al. |
| 2014/0281808 A1 | 9/2014 | Lam |
| 2015/0095551 A1 | 4/2015 | Confalonieri et al. |
| 2015/0113210 A1 | 4/2015 | Suzuki et al. |
| 2015/0356029 A1 | 12/2015 | Craske et al. |
| 2017/0053701 A1 | 2/2017 | Aritome |
| 2017/0062023 A1 | 3/2017 | Datta et al. |
| 2017/0083355 A1 | 3/2017 | Benoit et al. |
| 2018/0173580 A1 | 6/2018 | Pavlas et al. |

FOREIGN PATENT DOCUMENTS

| | | |
|---|---|---|
| JP | 2009123051 A | 6/2009 |
| JP | 2015082166 A | 4/2015 |
| KR | 10-2015-0096305 A | 8/2015 |
| KR | 10-2017-0084193 A | 7/2017 |
| TW | 200917272 A | 4/2009 |
| TW | 201135746 A | 10/2011 |
| TW | 201525998 A | 7/2015 |

OTHER PUBLICATIONS

Ipo, "Office Action," issued in connection with ROC (Taiwan) Patent Application No. 107146585, dated Jun. 27, 2019 (3 pages).

ISA/KR, International Search Report and Written Opinion of the International Searching Authority, Int'l. Appl. No. PCT/US2018/065769, dated Apr. 2, 2019, Korean Intellectual Property Office, Seo-gu, Daejeon, Republic of Korea, 14 pgs.

Japan Patent Office, "Notice of Rejection Ground," issued in connection with Japanese Patent Application No. 2020-535238, dated Aug. 24, 2021 (10 pages).

Grant of Patent received for Korean Patent Application No. 10-2020-7020702, dated Dec. 27, 2021, 4 pages (2 pages of English Translation and 2 pages of Original Document).

Chinese Patent Office, "Office Action", issued in connection with Chinese Patent Application No. 201880083469.2 dated Jan. 19, 2023 (13 pages).

Japan Patent Office, "Office Action," issued in connection with Japan Patent Application No. 2020-535238 dated Jan. 17, 2023 (5 pages) (2 pages of English Translation and 3 pages of Original Document).

* cited by examiner

TECHNIQUES TO UPDATE A TRIM PARAMETER IN NON-VOLATILE MEMORY

CROSS REFERENCE

The present Application for Patent is a continuation of U.S. patent application Ser. No. 16/848,608 by Qawami et al., entitled "TECHNIQUES TO UPDATE A TRIM PARAMETER IN NON-VOLATILE MEMORY", filed Apr. 14, 2020, which is a continuation of U.S. patent application Ser. No. 15/857,054 by Qawami et al., entitled "TECHNIQUES TO UPDATE A TRIM PARAMETER IN NON-VOLATILE MEMORY", filed Dec. 28, 2017, each of which is assigned to the assignee hereof and each of which is expressly incorporated by reference in its entirety herein.

BACKGROUND

The following relates generally to operating a memory array and more specifically to techniques to update a trim parameter in non-volatile memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3D XPoint™ (3DXP) memory, and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Various operating conditions for memory devices may be adjusted to enhance yield, performance, or reliability by fine-tuning some parameters within the memory devices.

DETAILED DESCRIPTION

Figure 1:
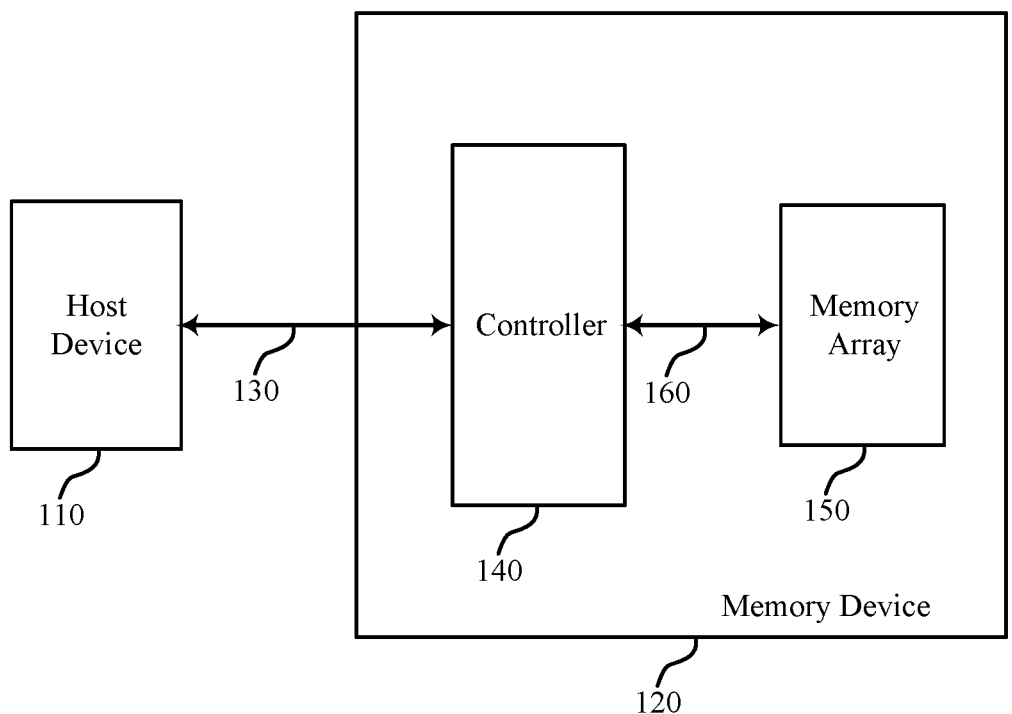
FIG. 1 illustrates an example of a system for storing electronic data in memory that supports techniques to update a trim parameter in non-volatile memory in accordance with embodiments of the present disclosure.

In some electronic memory systems, it may be desirable to adjust one or more trim parameters of a memory device after designing is done, after manufacturing is done, or after the memory device has been shipped and implemented with another computing device. Adjusting the trim parameters based on current electrical characteristics may enhance yield, performance, reliability, or a combination thereof. For example, as a memory device ages some of its characteristics may change. Trim parameters may be updated to improve performance based on the current characteristics rather than on outdated or inaccurate manufacturing or design characteristics.

Techniques to update or fine-tune some of the trim parameters during either a manufacturing stage or a post-manufacturing stage enables memory devices to operate in an optimum condition. The techniques to update a trim parameter may also provide a flexibility during manufacturing stage when a new technology is introduced to a memory device. During testing or design verification cycles, the techniques may allow an improved operating condition optimized for the new technology to override a default operating condition. The techniques may also enable various features (e.g., a higher performance or endurance, a lower temperature capability) targeted for specific operating conditions by updating trim parameters in light of environments under which the memory device may operate during a post-manufacturing stage.

Trim parameters may determine various operating conditions for a memory device. Trim parameters may be stored in a register (e.g., a manufacturing setting register) located within the memory device. The manufacturing setting register may have a set of entries and each entry of the set of entries may include a trim parameter. In some cases, trim parameters in a manufacturing setting register may be directly updated by a host device (e.g., a processor in a computing system, an external device to a memory device) through accessing a test mode. The test mode may allow the host device to modify operating conditions by directly accessing the manufacturing setting register. Such direct access to the manufacturing setting register by the host device may pose a risk of changing trim parameters beyond allowable operating conditions for memory devices or revealing details of memory device operations reserved as a trade secret.

In some cases, the manufacturing setting register is configured to be inaccessible by a host device during a normal mode of operation. In this manner, the host device may be prevented from adjusting trim parameters. Although the inaccessibility of the manufacturing setting register may prevent others from modifying or reverse-engineering portions of the memory device, this feature may also make it difficult to adjust trim parameters as operating characteristics of the memory device change.

Techniques are provided herein for allowing a host device or other user of a memory device to update trim parameter without giving the host device or other user direct access to the manufacturing setting register. Post-manufacturing updates to trim parameters stored in the manufacturing setting register may be feasible by creating another register (e.g., a user space register) located within a memory device that is accessible to the host device. The user space register may have a set of entries and each entry may be mapped to an entry of the manufacturing setting register. The mapping information may be stored in a translation register within the memory device that is inaccessible by the host device.

The host device may store an update to a trim parameter in an entry of the user space register. The memory device may identify a particular trim parameter in the manufacturing setting register that is targeted to be modified with the update in the entry of the user space register based on the mapping information stored in the translation register. Thus, the host device may not have a direct access to the manufacturing setting register but still be able to provide an update to a trim parameter in the manufacturing setting register by updating an entry in the user space register. In other words, reading or updating a trim parameter by a host device may be accomplished without entering a test mode.

An additional set of trim parameters beyond the ones defined by the translation register may be updated by a host device during a post-manufacturing stage, in some cases. A different register (e.g., a user-specified address register) may be created within a memory device that is accessible by the host device. The user-specified address register may include a set of entries. Each entry of the set of entries may be configured to store a trim parameter and an address of an entry of the manufacturing setting register corresponding to the trim parameter.

The memory device may identify a particular trim parameter in the manufacturing setting register that is targeted to be modified with the updates in the entry of the user-specified address register based on the address specified in the entry of the user-specified address register. Thus, the user-specified address register allows the host device to update a trim parameter of the manufacturing setting register that is not preconfigured with the translation register. In some embodiments, the user-specified address register is a specialized register to include both an address and an update to a trim parameter and configured to have a limited number of entries.

Features of the disclosure introduced above are further described below in the context of memory devices that include a memory array of non-volatile memory cell (e.g., 3DXP memory cells). Specific examples are then described for operating various registers within the memory devices in some embodiments. These and other features of the disclosure are further illustrated by and described with reference to apparatus diagrams, system diagrams, and flowcharts that relate to techniques to update a trim parameter in non-volatile memory.

FIG. 1 illustrates an electronic memory system 100 that supports techniques to update a trim parameter in non-volatile memory in accordance with examples of the present disclosure. The electronic memory system 100 may include a host device 110 and a memory device 120. In some cases, the electronic memory system 100 may be an example of an electronic device, a mobile computing device, a wireless device, a graphics processing unit, a hard drive, flash memory, a solid-state drive, an aspect of a data storage system, or the like. The host device 110 may be coupled with the memory device 120 by way of an interconnect 130. In some cases, the host device 110 may be a processor, a computing device, a system on a chip (SoC), or the like. The memory device 120 may include a controller 140 and a memory array 150. The controller 140 may be in electronic communication with the memory array 150 through a bus 160. In some embodiments, the memory array 150 includes memory cells utilizing various kinds of memory technologies (e.g., DRAM, FeRAM, NAND, flash memory, MRAM, PCM).

The memory device 120 may include a memory array including an array of PCM cells arranged in a three-dimensional architecture, such as 3D XPoint™ (3DXP). PCM cells in 3DXP architecture (which may also be referred to as 3DXP memory cell) may represent a logic state (e.g., a logic 1, a SET state) associated with a first set of threshold voltages or another logic state (e.g., a logic 0, a RESET state) associated with a second set of threshold voltages. In some embodiments, each PCM cell may include a selector device and be referred to as a PCMS memory cell. The SET state may be distinguished from the RESET state by a voltage window between the first set of threshold voltages and the second set of threshold voltage. In some embodiments, a demarcation voltage is placed near the midpoint of the voltage window during operation of the memory device to distinguish between the SET state and the RESET state. A trim parameter may define a specific value of the demarcation voltage for the memory device to use. In some cases, the demarcation voltage may need to be updated after a finite amount of cycling events (e.g., writing and erase operations performed on 3DXP memory cells) due to changes in the voltage window. The memory device 120 may update the trim parameter specifying the value of the demarcation voltage to a new value for the memory device 120 to use.

The controller 140 of the memory device 120 may include a manufacturing setting register and a translation register that are inaccessible by the host device 110. In some embodiments, the controller 140 of the memory device 120 includes a user space register and a user-specified address register that are accessible by the host device 110. The controller 140 may identify a trim parameter to use in the memory device 120 that is stored in an entry of the manufacturing setting register. In some cases, the controller 140 may identify an entry of the user space register associated with the trim parameter and read the entry of the user space register to update the trim parameter. Furthermore, the controller 140 may identify an entry of the user-specified address register associated with the trim parameter and read the entry of the user-specified address register to update the trim parameter.

Figure 2:
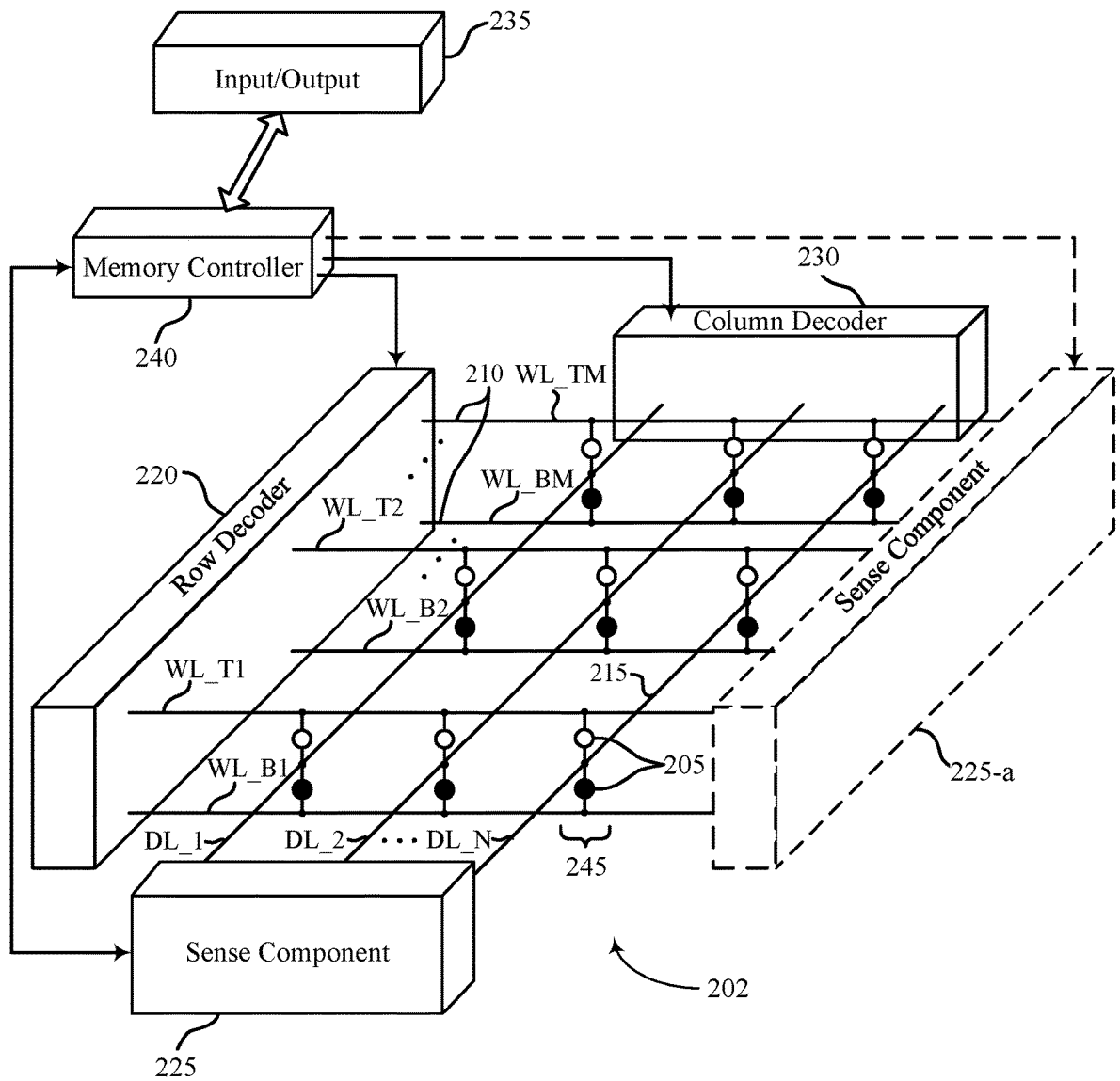
FIG. 2 illustrates an exemplary memory device that supports techniques to update a trim parameter in non-volatile memory in accordance with embodiments of the present disclosure.

FIG. 2 illustrates an exemplary memory device 200 in accordance with embodiments of the present disclosure. The memory device 200 may be an example of the memory device 120 described with reference to FIG. 1. Memory device 200 may also be referred to as an electronic memory apparatus. FIG. 2 is an illustrative representation of various components and features of the memory device 200. As such, it should be appreciated that the components and features of the memory device 200 shown to illustrate functional interrelationships, not their actual physical positions within the memory device 200. In the illustrative example of FIG. 2, the memory device 200 includes a three-dimensional (3D) memory array 202. The 3D memory array 202 may be an example of the memory array 150 described with reference to FIG. 1. The 3D memory array 202 includes memory cells 205 that may be programmable to store different states. In some embodiments, each memory cell 205 may be programmable to store two states, denoted as a logic 0 and a logic 1. In some embodiments, a memory cell 205 is configured to store more than two logic states. A memory cell 205 may, in some embodiments, include a 3DXP memory cell. Although some elements included in FIG. 2 are labeled with a numeric indicator, other corresponding elements are not labeled, though they are the same or would be understood to be similar, in an effort to increase visibility and clarity of the depicted features.

In some cases, the memory cells 205 (e.g., 3DXP memory cell) may include a phase change material that may have a threshold voltage associated with it—that is, a current may flow after an applied voltage exceeds the threshold voltage. Thus, if the applied voltage is less than the threshold voltage, no appreciable amount of current may flow. In some embodiments, the current flow or lack thereof, may be sensed by a sense component 225 to read stored information in the selected memory cell. In some embodiments, the material may be a chalcogenide alloy.

The 3D memory array 202 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. Based on the example depicted in FIG. 2, the memory array 202 includes two levels of memory cells 205 and may thus be considered a 3D memory array; however, the number of levels is not limited to two. Each level may be aligned or positioned so that memory cells 205 may be aligned (exactly, overlapping, or approximately) with one another across each level, forming a memory cell stack 245. In some cases, the memory cell stack 245 may include multiple 3DXP memory cells laid on top of another while sharing an access line for both.

In some embodiments, each row of memory cells 205 is connected to an access line 210, and each column of memory cells 205 is connected to a bit line 215. Access lines 210 and bit lines 215 may be substantially perpendicular to one another and may create an array of memory cells. As shown in FIG. 2, the two memory cells 205 in a memory cell stack 245 may share a common conductive line such as a bit line 215. That is, a bit line 215 may be in electronic communication with the bottom electrode of the upper memory cell 205 and the top electrode of the lower memory cell 205.

Other configurations may be possible, for example, a third layer may share an access line 210 with a lower layer. In general, one memory cell 205 may be located at the intersection of two conductive lines such as an access line 210 and a bit line 215. This intersection may be referred to as a memory cell's address. A target memory cell 205 may be a memory cell 205 located at the intersection of an energized access line 210 and bit line 215; that is, access line 210 and bit line 215 may be energized in order to read or write a memory cell 205 at their intersection. Other memory cells 205 that are in electronic communication with (e.g., connected to) the same access line 210 or bit line 215 may be referred to as untargeted memory cells 205.

As discussed above, electrodes may be coupled to a memory cell 205 and an access line 210 or a bit line 215. The term electrode may refer to an electrical conductor, and in some cases, may be employed as an electrical contact to a memory cell 205. An electrode may include a trace, wire, conductive line, conductive layer, or the like that provides a conductive path between elements or components of memory device 200. In some cases, a memory cell 205 may include a 3DXP memory cell having two terminals. As such, one terminal of the 3DXP memory cell may be electrically connected to a word line 210 and the other terminal of the 3DXP memory cell may be electrically connected to a digit line 215.

Access operations such as reading and writing may be performed on memory cells 205 by activating or selecting access line 210 and digit line 215. In some embodiments, access lines 210 may also be known as word lines 210, and bit lines 215 may also be known as digit lines 215. References to word lines and bit lines, or their analogues, are interchangeable without loss of understanding or operation. Activating or selecting a word line 210 or a digit line 215 may include applying a voltage to the respective line. Word lines 210 and digit lines 215 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 205 may be controlled through a row decoder 220 and a column decoder 230. For example, a row decoder 220 may receive a row address from a memory controller 240 and activate the appropriate word line 210 based on the received row address. Similarly, a column decoder 230 may receive a column address from the memory controller 240 and activate the appropriate digit line 215. For example, memory array 202 may include multiple word lines 210, labeled WL_T1 (or WL_B1) through WL_TM (or WL_BM), and multiple digit lines 215, labeled DL_1 through DL_N, where M and N depend on the array size. Thus, by activating a word line 210 and a digit line 215, e.g., WL_B2 and DL_3, the memory cell 205 at their intersection may be accessed.

Upon accessing, a memory cell 205 may be read, or sensed, by sense component 225 to determine the stored state of the memory cell 205. For example, a voltage may be applied to a memory cell 205 (using the corresponding word line 210 and bit line 215) and the presence of a resulting current may depend on the applied voltage and the threshold voltage of the memory cell 205. In some cases, more than one voltage may be applied. Additionally, if an applied voltage does not result in current flow, other voltages may be applied until a current is detected by sense component 225. By assessing the voltage that resulted in a current flow, the stored logic state of the memory cell 205 may be determined. In some cases, the voltage may be ramped up in magnitude until a current flow is detected. In other cases, predetermined voltages may be applied sequentially until a current is detected. Likewise, a current may be applied to a memory cell 205 and the magnitude of the voltage to create the current may depend on the electrical resistance or the threshold voltage of the memory cell 205.

Sense component 225 may include various transistors or amplifiers in order to detect and amplify a difference in the signals, which may be referred to as latching. The detected logic state of memory cell 205 may then be output through column decoder 230 as output 235. In some cases, sense component 225 may be part of a column decoder 230 or row decoder 220. Or, sense component 225 may be connected to or in electronic communication with column decoder 230 or row decoder 220. FIG. 2 also shows an alternative option of arranging the sense component 225-a (in a dashed box). An ordinary person skilled in the art would appreciate that a sense component may be associated either with a column decoder or a row decoder without losing its functional purposes.

A memory cell 205 may be set or written by similarly activating the relevant word line 210 and digit line 215 and at least one logic value may be stored in the memory cell 205. Column decoder 230 or row decoder 220 may accept data, for example input/output 235, to be written to the memory cells 205. In the case of a 3DXP memory cell including a chalcogenide alloy, a memory cell 205 may be written to store data by applying a programming pulse, for example, by modifying crystallographic phase of the chalcogenide alloy.

In some memory architectures, accessing the memory cell 205 may degrade or destroy the stored logic state and re-write or refresh operations may be performed to return the original logic state to memory cell 205. In DRAM, for example, the capacitor may be partially or completely discharged during a sense operation, corrupting the stored logic state. So the logic state may be re-written after a sense operation. Additionally, activating a single word line 210 may result in the discharge of all memory cells in the row; thus, several or all memory cells 205 in the row may need to be re-written. But in non-volatile memory, such as NAND, PCM, FeRAM, or 3DXP memory, accessing the memory cell 205 may not destroy the logic state and, thus, the memory cell 205 may not require re-writing after accessing.

The memory controller 240 may control the operation (e.g., read, write, re-write, refresh, discharge) of memory cells 205 through the various components, for example, row decoder 220, column decoder 230, and sense component 225. In some cases, one or more of the row decoder 220, column decoder 230, and sense component 225 may be co-located with the memory controller 240. The memory controller 240 may generate row and column address signals (e.g., voltage, current, timings) in order to activate the desired word line 210 and digit line 215. The memory controller 240 may also generate and control various voltages or currents used during the operation of memory device 200.

Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state. In addition, the memory controller 240 may identify a trim parameter to use in the memory device 200 that is stored in an entry of a manufacturing setting register. The manufacturing setting register may be inaccessible by a host device (not shown) external to the memory device 200. In some cases, the memory controller 240 identifies an entry of a user space register associated with the trim parameter and read the entry of the user space register to update the trim parameter. The user space register may be accessible by the host device. Furthermore, the memory controller 240 may identify an entry of a user-specified address register associated with the trim parameter and read the entry of the user-specified address register to update the trim parameter. The user-specified address register may be accessible by the host device.

Figure 3:
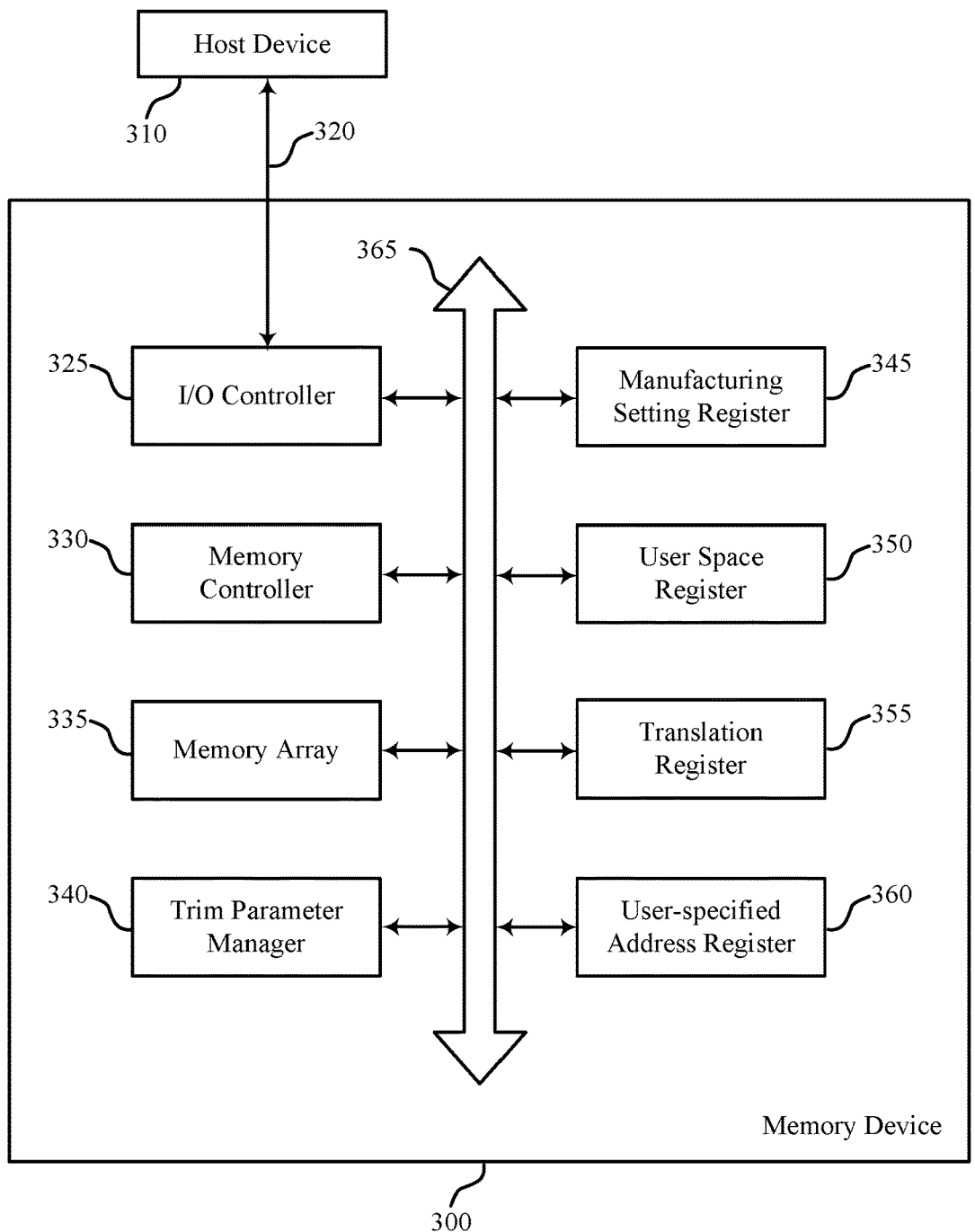
FIG. 3 illustrates an example of a memory device that supports techniques to update a trim parameter in non-volatile memory in accordance with embodiments of the present disclosure.

FIG. 3 illustrates an example of a memory device 300 that supports techniques to update a trim parameter in non-volatile memory in accordance with embodiments of the present disclosure. The memory device 300 may be an example of the memory device 120 or 200 described with reference to FIGS. 1 and 2. The memory device 300 may be coupled with a host device 310 by way of an interconnect 320. The host device 310 may be an example of the host device 110 described with reference to FIG. 1. The interconnect 320 may be an example of the interconnect 130 described with reference to FIG. 1. The memory device may include an I/O controller 325, a memory controller 330, a memory array 335, a trim parameter manager 340, a manufacturing setting register 345, a user space register 350, a translation register 355, and a user-specified address register 360. The components of the memory device 300 may be in electronic communication with one another through a bus 365. The bus 365 may be an example of the bus 160 described with reference to FIG. 1.

The various registers of the memory device 300 may include a set of entries. A register may be an example of any portion of memory dedicated to a particular purpose. For example, memory dedicated to storing trim parameters, updated trim parameters, information related to trim parameters, memory addresses related to trim parameters, or a combination thereof. In some cases, a register may be a stand-alone memory array. In some cases, a register may be a portion of a larger memory array. An entry of a register may be an example of a portion of memory the register.

For example, in some embodiments, the registers may be configured in a tabular format and each entry of the registers may correspond to a field of the table. Entries of the registers may be configured to hold data such as addresses of entries of various registers, identification of trim parameters (e.g., a demarcation voltage, a set of timings of a staircase SET pulse, a time delay between a write operation and a read operation), various operating conditions specifying particular voltage values, current values, timings, or any combination thereof. In some embodiments, a memory element representing one bit of the registers may include a circuit of more than one transistor (e.g., a static random-access memory cell with four transistors, a combination of various logic gates) that enables a fast access operation. In some embodiments, the registers may include an array of memory cells to store data. In some embodiments, the array of memory cells may be a portion of memory array 335.

The input/output (I/O) controller 325 may manage data communication between the memory controller 330 and the host device 310. The I/O controller 325 may also manage external peripherals that are not part of the memory device 300. In some cases, the I/O controller 325 may represent a physical connection or port to the external peripheral.

The memory controller 330 may be configured to operate with the host device 310. The memory controller 330 may be an example of the controller 140 or the memory controller 240 described with reference to FIGS. 1 and 2. The memory controller 330 may also be configured to operate with the I/O controller 325, the memory array 335, the trim parameter manager 340, the manufacturing setting register 345, the user space register 350, the translation register 355, the user-specified address register 360, or any combination thereof. In some embodiments, the memory controller 330 may identify a number of access operations (e.g., a read operation, a write operation) performed by a memory device 300. The memory controller 330 may automatically update one or more trim parameters of the manufacturing setting register 345 in response to potential changes in some of electrical characteristics of the memory device 300 based on the number of access operations.

The memory array 335 may include an array or arrays of memory cells to store digital information. The memory array 335 may be an example of the memory array 150 or 202 described with reference to FIGS. 1 and 2. The memory array 335 may be configured to operate with the memory controller 330. In some cases, the memory array 335 is integrated on a same die with the memory controller 330. In some cases, memory cells of the memory array 335 may include non-volatile, or volatile memory cells, or a combination of non-volatile and volatile memory cells. In some cases, the memory array 335 includes memory cells utilizing various kinds of memory technologies (e.g., DRAM, FeRAM, NAND, flash memory, MRAM, PCM). In some cases, the memory array 335 includes PCM cells configured in a three-dimensional cross-point architecture (e.g., 3DXP memory cells). 3DXP memory cells may include a chalcogenide alloy and be configured to have two terminals connected to an access line and a bit line where a 3DXP memory cell is formed at a topological cross-point of the access line and the bit line.

The trim parameter manager 340 may be configured to update trim parameters of the manufacturing setting register 345 without giving the host device 310 access to the manufacturing setting register 345. A trim parameter may include a type of the trim parameter (e.g., voltage, current) or an operating condition of the trim parameter (e.g., a particular value of voltage or current), or both. The trim parameter manager 340 may determine whether updates for the trim parameters exist. The trim parameter manager 340 may update the trim parameters of the manufacturing setting register 345 with new trim parameter settings received from the host device 310.

The trim parameter manager 340 may access one or more updated trim parameters and use those updated trim parameters instead of trim parameters stored in the manufacturing setting register 345. The trim parameter manager 340 may be configured to operate with the memory controller 330. In some cases, the trim parameter manager 340 may be integrated as a part of the memory controller 330. The trim parameter manager 340 may be configured to operate with the manufacturing setting register 345, the user space register 350, the translation register 355, the user-specified address register 360, or any combination thereof.

The manufacturing setting register 345 may be configured to store trim parameters for use in the memory device 300. In some cases, the manufacturing setting register 345 may be an example of read-only memory and the data stored in the manufacturing setting register 345 may not be modifiable during a normal mode of operation of the memory device 300.

The manufacturing setting register 345 may operate with the memory controller 330, the trim parameter manager 340, or both. The manufacturing setting register 345 includes a set of entries. Each entry may be identified with an address and include a trim parameter that determines a type of the trim parameter (e.g., voltage, current, timing or any combination thereof) or an operating condition of the trim parameter or both. A particular condition (e.g., a particular voltage value of a demarcation voltage) of a trim parameter may also be referred to as a trim parameter setting. Details of the trim parameters setting may be a trade secret. The manufacturing setting register 345 may be compiled during a product (e.g., memory device) design stage to include a set of trim parameters that may determine the product's yield, performance, or reliability. The manufacturing setting register 345 may be inaccessible by the host device 310 during normal mode of operation of the memory device 300.

The manufacturing setting register 345 may be configured to be inaccessible by the host device 310 during a normal mode of operation to prevent others from directly adjusting or accessing trim parameters during a post-manufacturing stage. Post-manufacturing updates to trim parameters stored in the manufacturing setting register may be feasible by creating registers (e.g., the user space register 350, the translation register 355, the user-specified address register 360) located within a memory device that are configured to receive and store updated trim parameters from the host device 310. Such a collection of registers may be configured to allow the host device 310 to update some specified trim parameters, but prevent the host device 310 from updating other trim parameters. Some of the registers (e.g., the user space register 350, the user-specified address register 360) are accessible to the host device 310 to update trim parameter settings.

In addition, a mapping information between the user space register 350 and the manufacturing setting register 345 may be stored in one of the registers (e.g., the translation register 355) that is inaccessible by the host device 310. In this manner, the host device 310 may not have a direct access to the manufacturing setting register 345 but still be able to provide an update to a trim parameter in the manufacturing setting register 345 by updating an entry in the user space register 350 or the user-specified address register 360. In some cases, the host device 310 may access the user space register 350 or the user-specified address register 360 to determine a current value of a trim parameter before updating the trim parameter. As such, the host device 310 may have a read/write access to an entry of the user space register 350 or the user-specified address register 360 mapped to the trim parameter.

The user space register 350 may be configured to store trim parameters for use in the memory device 300 that were received from the host device 310. The user space register 350 may be configured with entries that are dedicated to a specific type of trim parameter. In this manner, the host device 310 may have the ability to modify only a subset of trim parameters included in the user space register 350.

The user space register 350 may operate with the memory controller 330, the trim parameter manager 340, or both. The user space register 350 includes a set of entries and each entry of the set of entries may include an update to a trim parameter (e.g., a trim parameter setting). The user space register 350 may be accessible by the host device 310. In other words, the host device 310 may determine content of each entries (e.g., a trim parameter setting) of the user space register 350 through the memory controller 330 or the trim parameter manager 340. The content of each entries of the user space register 350 may include an operating condition of a trim parameter determined during a manufacturing stage (e.g., an optimal operating condition determined during a testing or a design validation cycle). In addition, the content of each entries of the user space register 350 may be updated by the host device 310 during a post-manufacturing stage to specify an updated trim parameter setting for a trim parameter that may provide a more suitable operating condition for the memory device 300 in light of a potential change in electrical characteristics of the memory device 300 due to a usage or aging of the memory device 300. In some embodiments, the memory controller 330 receives, from the host device 310, a trim parameter and a command to store the trim parameter in a first entry of the user space register 350. Subsequently, the memory controller 330 may write the trim parameter in the first entry of the user space register 350 based on receiving the trim parameter and the command from the host device 310.

The translation register 355 may be configured to map entries of the manufacturing setting register 345 to entries of the user space register 350. To prevent a host device 310 from accessing the manufacturing setting register 345, the memory device 300 may include the user space register 350 with predefined entries dedicated to certain trim parameters. To know the relationship between the entries of the manufacturing setting register 345 and the entries of the user space register 350, the translation register 355 may store a mapping between such entries. In some cases, the translation register 355 may be inaccessible to the host device 310, thereby preventing the host device 310 from accessing the manufacturing setting register 345 as well.

The translation register 355 may operate with the memory controller 330, the trim parameter manager 340, or both. The translation register 355 includes a set of entries. Each entry of the translation register 355 may include a mapping between an entry of the user space register 350 and an entry of the manufacturing setting register 345. In some cases, the translation register is a look-up table within the memory device. Entire mapping information of the translation register 355 may be backed-up by a fuse network (not shown) that may be programmed during a manufacturing stage. The mapping information stored in the fuse network may be non-volatile so that the mapping information can be retained without an electrical power.

The memory controller 330 (or the trim parameter manager 340) may determine that an entry (e.g., an operating condition of a trim parameter) of the manufacturing setting register 345 may be updated by the host device 310 by examining the entries of the translation register 355. The memory controller 330 (or the trim parameter manager 340) may check for an updated trim parameter setting from the user space register 350 based on the trim parameter being included in the translation register 355. The memory controller 330 may determine a corresponding entry in the manufacturing setting register 345 based on the mapping information stored in the translation register 355.

If the user space register 350 includes an updated trim parameter, in some cases, the memory controller may update a trim parameter setting of the corresponding entry in the manufacturing setting register 345 such that the memory device 300 can operate with the updated operating condition specified by the host device 310. It should be appreciated that the host device 310 (e.g., an external device to the memory device 300) does not directly access contents of the manufacturing setting register 345 so as to prevent inadvertent harmful operating conditions implemented in the manufacturing setting register 345 as well as to provide a resilience against a malicious attempt to directly access contents of the manufacturing setting register 345.

The user-specified address register 360 may be configured to store trim parameters for use in the memory device 300 that were received from the host device 310, but were not included in the user space register 350. The user-specified address register 360 may be configured to store updated trim parameters received from the host device 310 that are not mapped in a translation register 355. Such a type of register provides additional flexibility as compared to the user space register 350 and the translation register 355. In order to store a valid updated trim parameter, the user-specified address register 360 may also store an address of the manufacturing setting register 345 associated with the updated trim parameter. An entry of the user-specified address register 360 may be configured to store any type of trim parameter. In some cases, the user-specified address register 360 may be used in conjunction with a user space register 350 and/or a translation register 355. In some cases, the user-specified address register 360 may be used without the user space register 350 and/or the translation register 355.

In order to update trim parameters using the user-specified address register, the host device 310 may need to know an address associated with the trim parameter (e.g., an address of the entry of the manufacturing setting register 345 associated with that specific trim parameter of that specific type of trim parameter). In some cases, an entity associated with the memory device 300 may provide the host device 310 with such an address, either on request or as part of a memory device 300 update. In some cases, the address may be the address of an entry of the manufacturing setting register 345. In other cases, the address may be an address of a translation register 355 that includes a mapping, thereby restricting the host device's knowledge about the manufacturing setting register 345.

In some examples, the user-specified address register 360 may operate with the memory controller 330, the trim parameter manager 340, or both. The user-specified address register 360 includes a set of entries. The user-specified address register 360 may be accessible by the host device 310. In other words, the host device 310 may determine content of each entry of the user-specified address register 360 through the memory controller 330 or the trim parameter manager 340. Each entry of the user-specified address register 360 may include an address of an entry of the manufacturing setting register 345 and an updated trim parameter setting for the trim parameter corresponding to the address. In some embodiments, the memory controller 330 receives, from the host device 310, a trim parameter and an address of a first entry of the manufacturing setting register 345. Subsequently, the memory controller 330 may write the trim parameter and the address of first entry of the manufacturing setting register 345 in a second entry of the user-specified address register 360.

The content of each entry of the user-specified address register 360 may be unspecified during a manufacturing stage. The content of each entry of the user-specified address register 360 may be updated by the host device 310 during a post-manufacturing stage to specify an address of an entry of the manufacturing setting register 345 and an updated trim parameter setting for the trim parameter corresponding to the address of the entry. It should be appreciated that the user-specified address register 360 may enable the host device 310 to update a trim parameter that has not been identified as determinative of performance or reliability of the memory device 300 during a manufacturing stage. In other words, the host device 310 may update an inaccessible trim parameter that has not been identified during a manufacturing stage through the user-specified address register 360.

In some cases, updating the trim parameter may be based on operating conditions associated with the host device. In some cases, updating the trim parameter may be based on a number of access operation performed a memory cell or a memory array satisfying a threshold or a timer satisfying a threshold. As a memory array ages or is used, its operating conditions may change. For example, stress on components of the memory device 300 may causes operating characteristics to change. In some cases, system updates to the memory device 300 may be configured to keep the memory device 300 working efficiently even as operating characteristics change. An entity associated with the memory device 300 may periodically issue system updates for the memory device 300 with updated trim parameters based on changing operating conditions.

Figure 4:
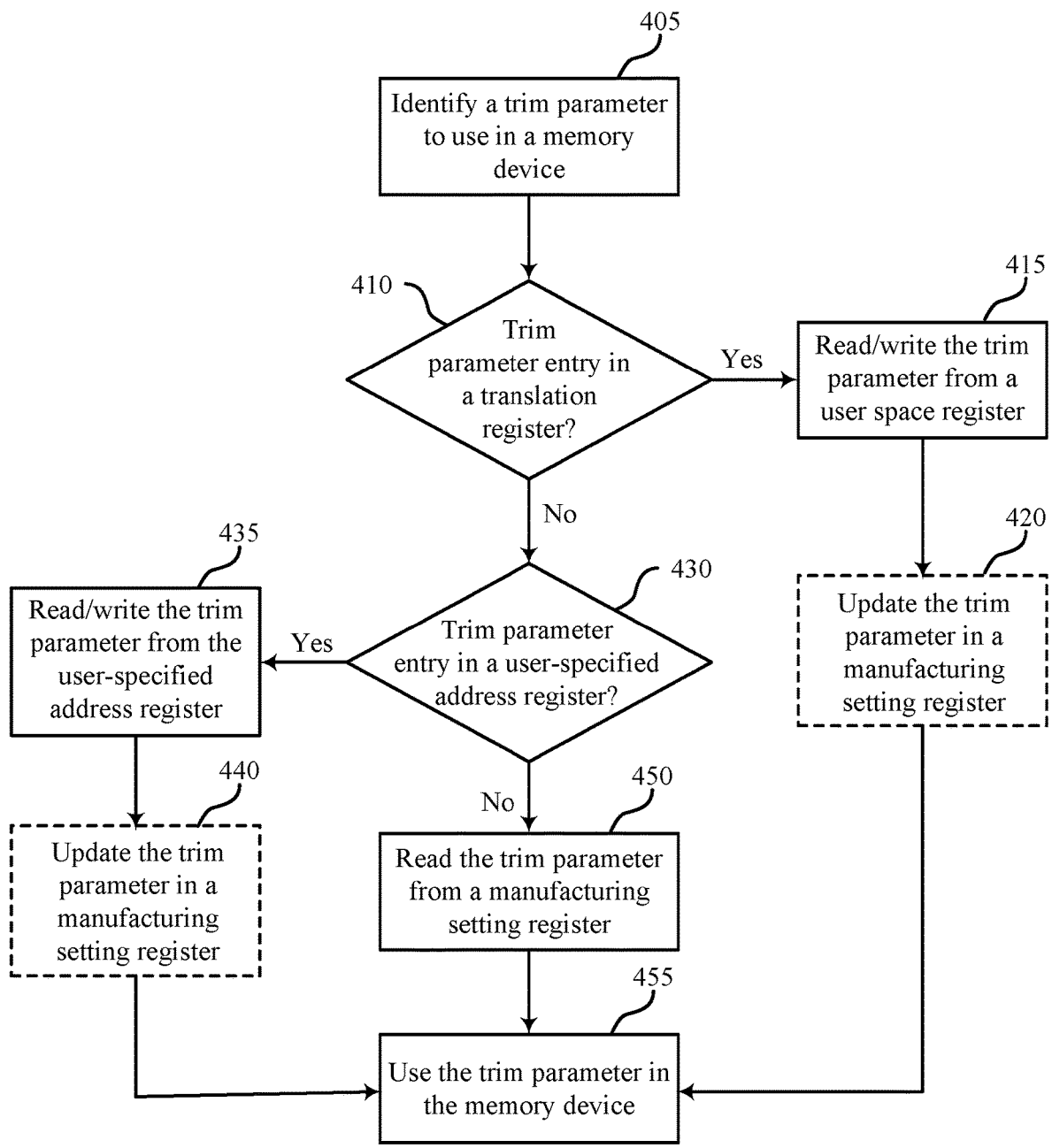
FIG. 4 illustrates an example of a process flow diagram that supports techniques to update a trim parameter in non-volatile memory in accordance with embodiments of the present disclosure.

FIG. 4 illustrates an exemplary diagram of a process flow 400 that supports techniques to update a trim parameter in non-volatile memory in accordance with embodiments of the present disclosure. The features of process flow 400 may be implemented or performed by a device (e.g., a memory device 120, 200, or 300 described with reference to FIGS. 1 through 3) or a component of a memory device such as the controller 140, the memory controller 240 or 330, or the trim parameter manager 340 described with reference to FIGS. 1 through 3. Although described with reference to 3DXP memory operations, the aspects and features of process flow 400 can be implemented in a memory device employing a different memory technology (e.g., DRAM, FeRAM, NAND, flash memory, MRAM, PCM, PCMS).

At block 405, the memory controller may identify a trim parameter to use in the memory device. A trim parameter may include a type of the trim parameter (e.g., voltage, current) or an operating condition of the trim parameter (e.g., a particular value of voltage or current), or both for various operations of the memory device. As a way of example, a trim parameter may specify a set of timings for a staircase SET pulse to be applied to a 3DXP memory cell.

Additional examples of trim parameters may include a trim parameter specifying a value of demarcation voltage that is placed near a midpoint of a voltage window to distinguish between a first state (e.g., a logic 1, a SET state) and a second state (e.g., a logic 0, a RESET state), a trim parameter specifying a time delay between a write operation performed on a memory cell and a read operation accessing the memory cell, or the like. Entries of a manufacturing setting register may include operating conditions (e.g., trim-parameter settings) for trim parameters. The trim parameters settings (e.g., a set of particular timings for the staircase SET pulse, a particular value of the demarcation voltage, a particular value of the time delay) may be determined during a manufacturing stage of the memory device (e.g., a testing or a design verification cycle). The memory controller may also identify an entry of the manufacturing setting register that stores the identified trim parameter. The manufacturing setting register may be inaccessible to a host device.

In some cases, the functions of block 405 may be done in response to a power-up event. When a memory device powers down or goes into a low-power mode, the memory device may erase its trim parameters being actively used. When the memory device powers back up, the memory device may have to re-implement its trim parameters. If the memory device is configured to allow trim parameters to be updated by a host device, the memory device may be configured to check more than one register for the proper trim parameter.

At block 410, the memory controller may access a translation register to determine whether the trim parameter is modifiable by an update from a host device. The translation register includes a set of entries and each entry of the set of entries may include a mapping between an entry of the manufacturing setting register and an entry of a user space register. A host device may have an updated trim parameter setting in an entry of the user space register for the memory device to use. In some examples, an entry in the translation register describing a mapping between the first entry (e.g., specifying a set of timings of the staircase SET pulse) of the manufacturing setting register and a second entry of the user space register indicates that an updated operating condition for the trim parameter (e.g., a new set of conditions for the set of timings of the staircase SET pulse) may exist in the user space register. On the contrary, absence of such a mapping may indicate that the user space register does not include an updated operating condition for the trim parameter. In some cases, the memory controller may check one or more bits stored in the manufacturing setting register to determine whether trim parameter is modifiable. The one or more bits may be configured to indicate whether the trim parameter stored in that specific entry of the manufacturing setting register is modifiable.

At block 415, if the translation register includes the mapping between the first entry of the manufacturing setting register and the second entry of the user space register, the memory controller may check to see if the user space register includes a trim parameter stored in the entry specified in the translation register. If the user space register includes data stored in the specified entry, the memory controller may read or write an updated trim parameter setting (e.g., an updated set of timings for the staircase SET pulse) to or from the second entry of the user spacer register. In some cases, a host device may identify what a trim parameter is by reading an address associated with an entry of the user space register that is mapped to the trim parameter.

Optionally, at block 420, the memory controller may update the trim parameter in the manufacturing setting register based on reading the updated trim parameter setting from the user space register so that the memory controller may provide the updated operating condition (e.g., the updated trim parameter setting) for the memory device to use. In some cases, the memory controller may not update the trim parameter in the manufacturing setting register if the trim parameter setting read from the user space register is the same as the trim parameter setting in the manufacturing setting register (e.g., the host device may not have updated an operating condition for the trim parameter that have been determined during a manufacturing stage).

At block 455, the memory controller may use the trim parameter to specify an operating condition for the memory device to use (e.g., either an updated set of timings for the staircase SET pulse or a set of timings that has been determined during a manufacturing stage). For example, at block 455, the memory controller may store the correct trim parameter in a memory array to be used during an active session of the memory device.

At block 430, the memory controller, after determining that the translation register does not include such a mapping described with reference to block 410, may access a user-specified address register to determine whether the trim parameter is modifiable by an update from the host device. The user-specified address register includes a set of entries and each entry of the set of entries may include an address of an entry of the manufacturing setting register and an updated trim parameter setting for the trim parameter corresponding to the address. In some cases, the memory controller may identify a range of the addresses associated with the set of entries and determine that the range of the addresses is within a valid trim update address range.

As one example, an entry in the user-specified address register describing an address of the first entry of the manufacturing setting register and an update to a trim parameter corresponding the entry of the manufacturing setting register indicates that an updated operating condition for the trim parameter exists in the user-specified address register. On the contrary, absence of such an entry in the user-specified address register may indicate that the user-specified address register does not include an updated operating condition for the trim parameter corresponding to the address of the first entry of the manufacturing setting register. In some cases, the memory controller may access the user-specified address register without accessing the translation register or the user space register. For example, a memory device may not include the translation register or the user space register. In some cases, the memory controller may access the user-specified address register even if the translation register includes a mapping of the trim parameter. In such cases, the user space register may include an updated trim parameter that take priority over the trim parameter stored in the manufacturing setting register and the user-specified address register may include an updated trim parameter that takes priority over both of those other trim parameters.

At block 435, if the user-specified address register includes an entry describing an address of an entry of the manufacturing setting register and an update to a trim parameter corresponding the entry of the manufacturing setting register, the memory controller may read or write the address of the entry and the updated trim parameter setting to or from the user-specified address register. In some cases, a host device may identify what a trim parameter is by reading the address of the entry of the manufacturing setting register described in the entry of the user-specified address register.

Optionally, at block 440, the memory controller may update the trim parameter in the manufacturing setting register based on reading the address of the entry and the updated trim parameter setting from the user-specified address register so that the memory controller may provide the updated operating condition (e.g., the updated trim parameter setting) for the memory device to use. In some cases, the memory controller may not update the trim parameter in the manufacturing setting register if the trim parameter setting read from the user-specified address register is the same as the trim parameter setting in the manufacturing setting register.

At block 450, if the translation register does not include a mapping for the first entry of the manufacturing setting register and the user-specified address register does not include an entry describing an address of the first entry of the manufacturing setting register and an update to a trim parameter corresponding the first entry of the manufacturing setting register, the memory controller may read the trim parameter from the manufacturing setting register (e.g., conditions for a set of timings for a staircase SET pulse determined during a manufacturing stage) for the memory device to use.

The memory controller may skip operations described with reference to the blocks 410, 415, and 420 to perform operations described with reference to the blocks 430, 435, and 440. In some embodiments, the memory controller may perform operations described with reference to the blocks 410, 415, and 420 as well as operations described below with reference to the blocks 430, 435, and 440. In some embodiments, the memory controller may determine that the trim parameter is modifiable by the host device based on information included in the manufacturing setting register. In some embodiments, each entry of the manufacturing setting register may include an extra bit to indicate whether the trim parameter is modifiable by the host device. In some embodiments, the information in the entry of the manufacturing setting may be used in conjunction with the translation register or the user-specified address register to determine whether the trim parameter is modifiable by the host device. In some embodiments, when a power is absent to the memory device, the trim parameters in the manufacturing setting register may be reset to their operating conditions determined during a manufacturing stage. When the memory controller detects a power-up event, the memory controller may perform the process flow 400 described above to update the trim parameters in the manufacturing setting register.

Figure 5:
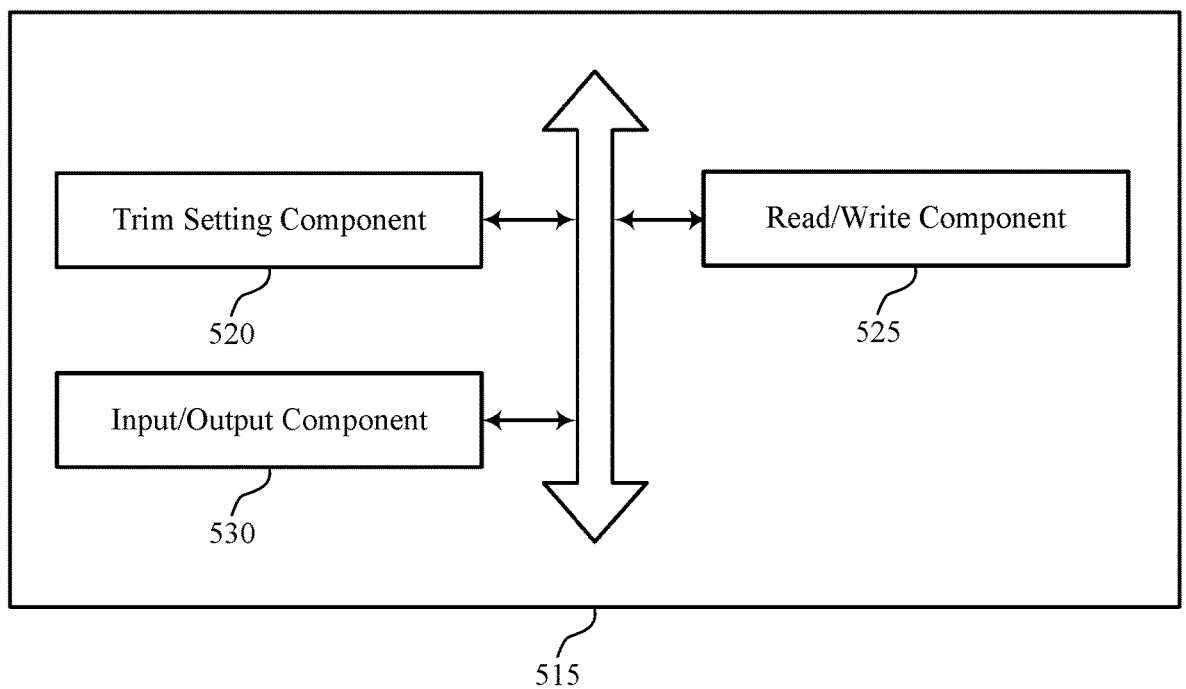
FIG. 5 shows a block diagram of a device that supports techniques to update a trim parameter in non-volatile memory in accordance with embodiments of the present disclosure.

FIG. 5 shows a block diagram 500 of a trim parameter manager 515 that supports techniques to update a trim parameter in non-volatile memory in accordance with embodiments of the present disclosure. The trim parameter manager 515 may be an example of the trim parameter manager 340 described with reference to FIG. 3. The trim parameter manager 515 may be executed by a memory controller such as the controller 140 or the memory controller 240 or 330 described with reference to FIGS. 1 through 3. The trim parameter manager 515 may include a trim setting component 520, a read/write component 525, and an input/output component 530. Each of these modules may communicate, directly or indirectly, with one another (e.g., via one or more buses).

Trim setting component 520 may identify a trim parameter to use in a memory device stored in a first entry of a first register inaccessible to a host device, access a translation register inaccessible to the host device to determine whether the trim parameter is modifiable, and write the trim parameter in the first entry of the first register based on receiving the trim parameter and the command. Trim setting component 520 may identify a second entry of a second register inaccessible by the host device based on writing the trim parameter, where the first entry of the first register is linked to the second entry of the second register based on a mapping included in a translation register that is inaccessible to the host device. Trim setting component 520 may access a third register accessible to the host device to determine whether an entry of the third register includes the trim parameter and an address for the first entry of the first register associated with the trim parameter, where reading the trim parameter further includes reading the entry of the third register. Trim setting component 520 may determine that the trim parameter is not included in a second register accessible by the host device and a third register accessible by the host device based on accessing the translation register and the third register, where reading the trim parameter further includes reading the first entry of the first register.

Trim setting component 520 may determine that the trim parameter is modifiable by the host device based on information included in the first register inaccessible to the host device, where accessing the translation register is based on determining that the trim parameter is modifiable. Trim setting component 520 may update the trim parameter in the second entry of the second register based on identifying the second entry. Trim setting component 520 may identify a second entry of a second register accessible to the host device associated with the trim parameter based on accessing the translation register, where reading the trim parameter further includes reading the second entry of the second register. Trim setting component 520 may determine that the trim parameter is not included in a second register accessible by the host device based on accessing the translation register. Trim setting component 520 may determine the mapping based on the translation register that includes the mapping, the translation register being inaccessible by the host device, where an entry of the translation register is configured to match an entry of the first register to an entry of the second register.

Trim setting component 520 may detect a power-up event, where updating the trim parameter is based on detecting the power-up event. Trim setting component 520 may determine that the second entry of the second register is able to be modified based on information included in the second register, where updating the trim parameter is based on determining that the second entry is able to be modified. Trim setting component 520 may identify a number of access operations performed by a memory device and automatically update at least one trim parameter of the second register based on identifying the number of access operations performed. Trim setting component 520 may update the trim parameter is done without entering a test mode. Trim setting component 520 may write the trim parameter and the address of the first entry in a second entry of second register that is accessible by the host device based on receiving the trim parameter and the address of the first entry. Trim setting component 520 may write the trim parameter in the first entry of the first register based on writing the trim parameter in the second entry of the second register.

Read/write component 525 may read the trim parameter based on accessing the translation register. Read/write component 525 may read the trim parameter without entering a test mode.

Input/output component 530 may receive, from a host device, a trim parameter and a command to store the trim parameter in a first entry of a first register accessible by the host device. Input/output component 530 may receive, from a host device, a trim parameter and an address of a first entry of a first register associated with the trim parameter, the first register being inaccessible to the host device.

Figure 6:
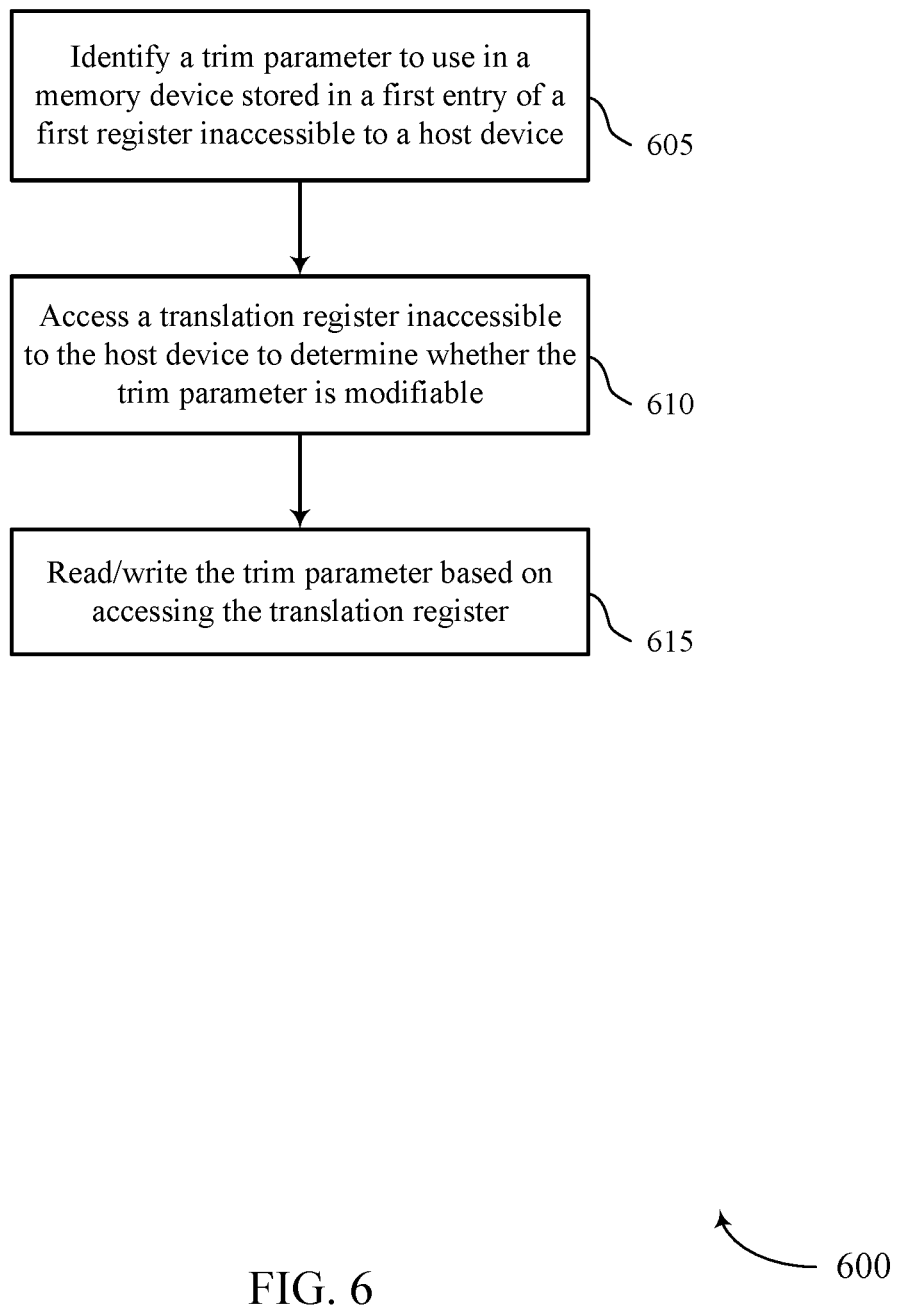
FIGS. 6 through 8 illustrate methods for techniques to update a trim parameter in non-volatile memory in accordance with embodiments of the present disclosure.

FIG. 6 shows a flowchart illustrating a method 600 for techniques to update a trim parameter in non-volatile memory in accordance with embodiments of the present disclosure. The operations of method 600 may be implemented by a memory device 120 or its components as described herein. For example, the operations of method 600 may be performed by the controller 140 or the memory controller 240, 330 as described with reference to FIGS. 1 through 3. In some embodiments, the memory device 120 may execute a set of codes to control the functional elements of the device to perform the functions described below. Additionally or alternatively, the memory device 120 may perform aspects of the functions described below using special-purpose hardware.

At block 605 the memory device 120 may identify a trim parameter to use in a memory device stored in a first entry of a first register inaccessible to a host device. The operations of 605 may be performed according to the methods described herein. In certain examples, aspects of the operations of 605 may be performed by a trim setting component as described with reference to FIG. 5.

At block 610 the memory device 120 may access a translation register inaccessible to the host device to determine whether the trim parameter is modifiable. The operations of 610 may be performed according to the methods described herein. In certain examples, aspects of the operations of 610 may be performed by a trim setting component as described with reference to FIG. 5.

At block 615 the memory device 120 may read or write the trim parameter based at least in part on accessing the translation register. In some cases, the memory device 120 may write the trim parameter based at least in part on accessing the translation register. The operations of 615 may be performed according to the methods described herein. In certain examples, aspects of the operations of 615 may be performed by a read component as described with reference to FIG. 5.

In some cases, the method 600 may also include identifying a second entry of a second register accessible to the host device associated with the trim parameter based at least in part on accessing the translation register, wherein reading the trim parameter further comprises reading the second entry of the second register. In some cases, the method 600 may also include determining that the trim parameter is not included in a second register accessible by the host device based at least in part on accessing the translation register and accessing a third register accessible to the host device to determine whether an entry of the third register includes the trim parameter and an address for the first entry of the first register associated with the trim parameter, wherein reading the trim parameter further comprises reading the entry of the third register.

In some cases, the method 600 may also include determining that the trim parameter is not included in a second register accessible by the host device and a third register accessible by the host device based at least in part on accessing the translation register and the third register, wherein reading the trim parameter further comprises reading the first entry of the first register. In some cases, the method 600 may also include determining that the trim parameter is modifiable by the host device based at least in part on information included in the first register inaccessible to the host device, wherein accessing the translation register is based at least in part on determining that the trim parameter is modifiable. In some cases, the trim parameter includes a type of the trim parameter or an operating condition of the trim parameter or both. In some cases, the memory device coupled with the host device is a three dimensional cross-point memory device. In some cases, reading the trim parameter is done without entering a test mode.

In some embodiments, an apparatus for techniques to update a trim parameter in non-volatile memory is described. The apparatus may include means for identifying a trim parameter to use in a memory device stored in a first entry of a first register inaccessible to a host device, means for accessing a translation register inaccessible to the host device to determine whether the trim parameter is modifiable, and means for reading the trim parameter based at least in part on accessing the translation register.

In some cases, the apparatus may include means for identifying a second entry of a second register accessible to the host device associated with the trim parameter based at least in part on accessing the translation register, wherein reading the trim parameter further comprises reading the second entry of the second register. In some cases, the apparatus may include means for determining that the trim parameter is not included in a second register accessible by the host device based at least in part on accessing the translation register and means for accessing a third register accessible to the host device to determine whether an entry of the third register includes the trim parameter and an address for the first entry of the first register associated with the trim parameter, wherein reading the trim parameter further comprises reading the entry of the third register. In some cases, the apparatus may include means for determining that the trim parameter is not included in a second register accessible by the host device and a third register accessible by the host device based at least in part on accessing the translation register and the third register, wherein reading the trim parameter further comprises reading the first entry of the first register. In some cases, the apparatus may include means for determining that the trim parameter is modifiable by the host device based at least in part on information included in the first register inaccessible to the host device, wherein accessing the translation register is based at least in part on determining that the trim parameter is modifiable.

Figure 7:
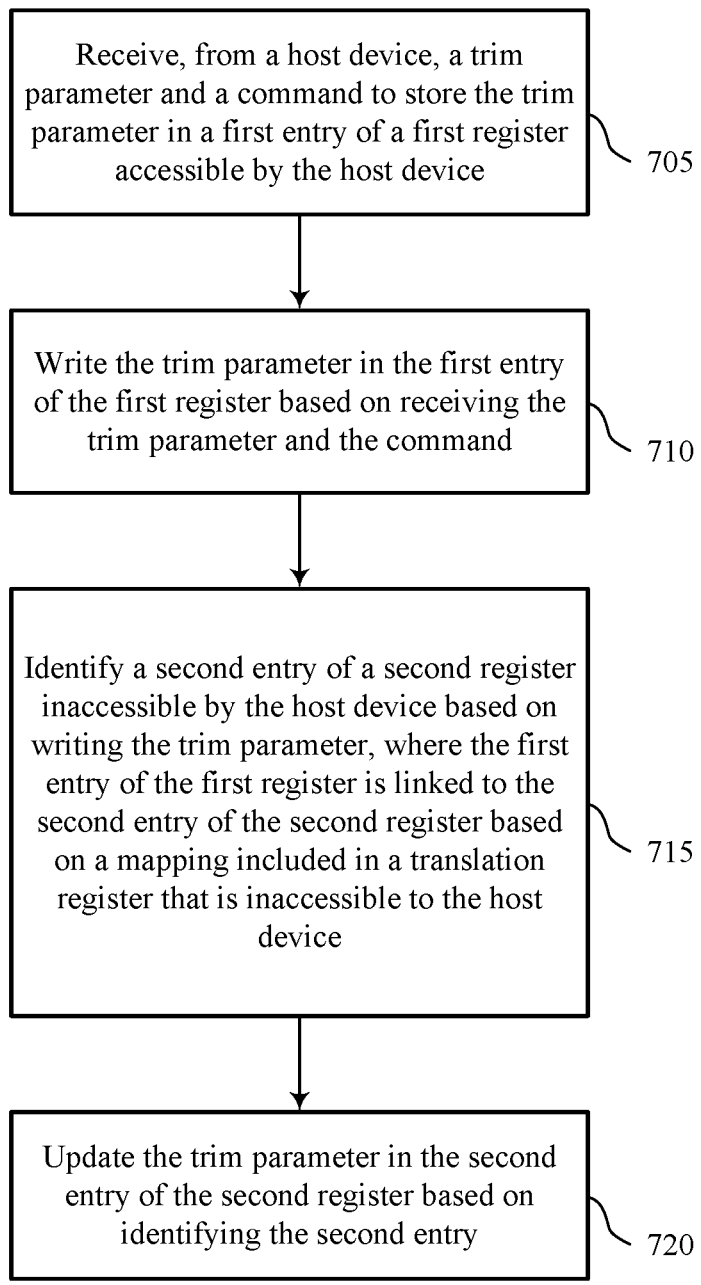

FIG. 7 shows a flowchart illustrating a method 700 for techniques to update a trim parameter in non-volatile memory in accordance with embodiments of the present disclosure. The operations of method 700 may be implemented by a memory device 120 or its components as described herein. For example, the operations of method 700 may be performed by the controller 140 or the memory controller 240, 330 as described with reference to FIGS. 1 through 3. In some embodiments, the memory device 120 may execute a set of codes to control the functional elements of the device to perform the functions described below. Additionally or alternatively, the memory device 120 may perform aspects of the functions described below using special-purpose hardware.

At block 705 the memory device 120 may receive, from a host device, a trim parameter and a command to store the trim parameter in a first entry of a first register accessible by the host device. In some cases, the memory device 120 may receive, from a host device, a read command or a write command associated with data. The operations of 705 may be performed according to the methods described herein. In certain examples, aspects of the operations of 705 may be performed by an input/output component as described with reference to FIG. 5.

At block 710 the memory device 120 may write the trim parameter in the first entry of the first register based at least in part on receiving the trim parameter and the command. The operations of 710 may be performed according to the methods described herein. In certain examples, aspects of the operations of 710 may be performed by a trim setting component as described with reference to FIG. 5.

At 715 the memory device 120 may identify a second entry of a second register inaccessible by the host device based at least in part on writing the trim parameter, wherein the first entry of the first register is linked to the second entry of the second register based at least in part on a mapping included in a translation register that is inaccessible to the host device. The operations of 715 may be performed according to the methods described herein. In certain examples, aspects of the operations of 715 may be performed by a trim setting component as described with reference to FIG. 5.

At 720 the memory device 120 may update the trim parameter in the second entry of the second register based at least in part on identifying the second entry. The operations of 720 may be performed according to the methods described herein. In certain examples, aspects of the operations of 720 may be performed by a trim setting component as described with reference to FIG. 5.

In some cases, the method 700 may also include determining the mapping based at least in part on the translation register that includes the mapping, the translation register being inaccessible by the host device, wherein an entry of the translation register is configured to match an entry of the first register to an entry of the second register. In some cases, the translation register uses a fused back architecture to assign entries of the first register and the second register. In some cases, the method 700 may also include detecting a power-up event, wherein updating the trim parameter is based at least in part on detecting the power-up event. In some cases, the method 700 may also include determining that the second entry of the second register is able to be modified based at least in part on information included in the second register, wherein updating the trim parameter is based at least in part on determining that the second entry is able to be modified.

In some cases, the method 700 may also include identifying a number of access operations performed by a memory device and automatically updating at least one trim parameter of the second register based at least in part on identifying the number of access operations performed. In some cases, the trim parameter includes a type of the trim parameter or an operating condition of the trim parameter or both.

In some cases, a memory device coupled with the host device is a three dimensional cross-point memory device. In some cases, updating the trim parameter is done without entering a test mode.

In some embodiments, an apparatus for techniques to update a trim parameter in non-volatile memory is described. The apparatus may include means for receiving, from a host device, a trim parameter and a command to store the trim parameter in a first entry of a first register accessible by the host device, means for writing the trim parameter in the first entry of the first register based at least in part on receiving the trim parameter and the command, means for identifying a second entry of a second register inaccessible by the host device based at least in part on writing the trim parameter, wherein the first entry of the first register is linked to the second entry of the second register based at least in part on a mapping included in a translation register that is inaccessible to the host device, and means for updating the trim parameter in the second entry of the second register based at least in part on identifying the second entry.

In some cases, the apparatus may include means for determining the mapping based at least in part on the translation register that includes the mapping, the translation register being inaccessible by the host device, wherein an entry of the translation register is configured to match an entry of the first register to an entry of the second register. In some cases, the apparatus may include means for detecting a power-up event, wherein updating the trim parameter is based at least in part on detecting the power-up event.

In some cases, the apparatus may include means for determining that the second entry of the second register is able to be modified based at least in part on information included in the second register, wherein updating the trim parameter is based at least in part on determining that the second entry is able to be modified. In some cases, the apparatus may include means for identifying a number of access operations performed by a memory device and means for automatically updating at least one trim parameter of the second register based at least in part on identifying the number of access operations performed.

Figure 8:
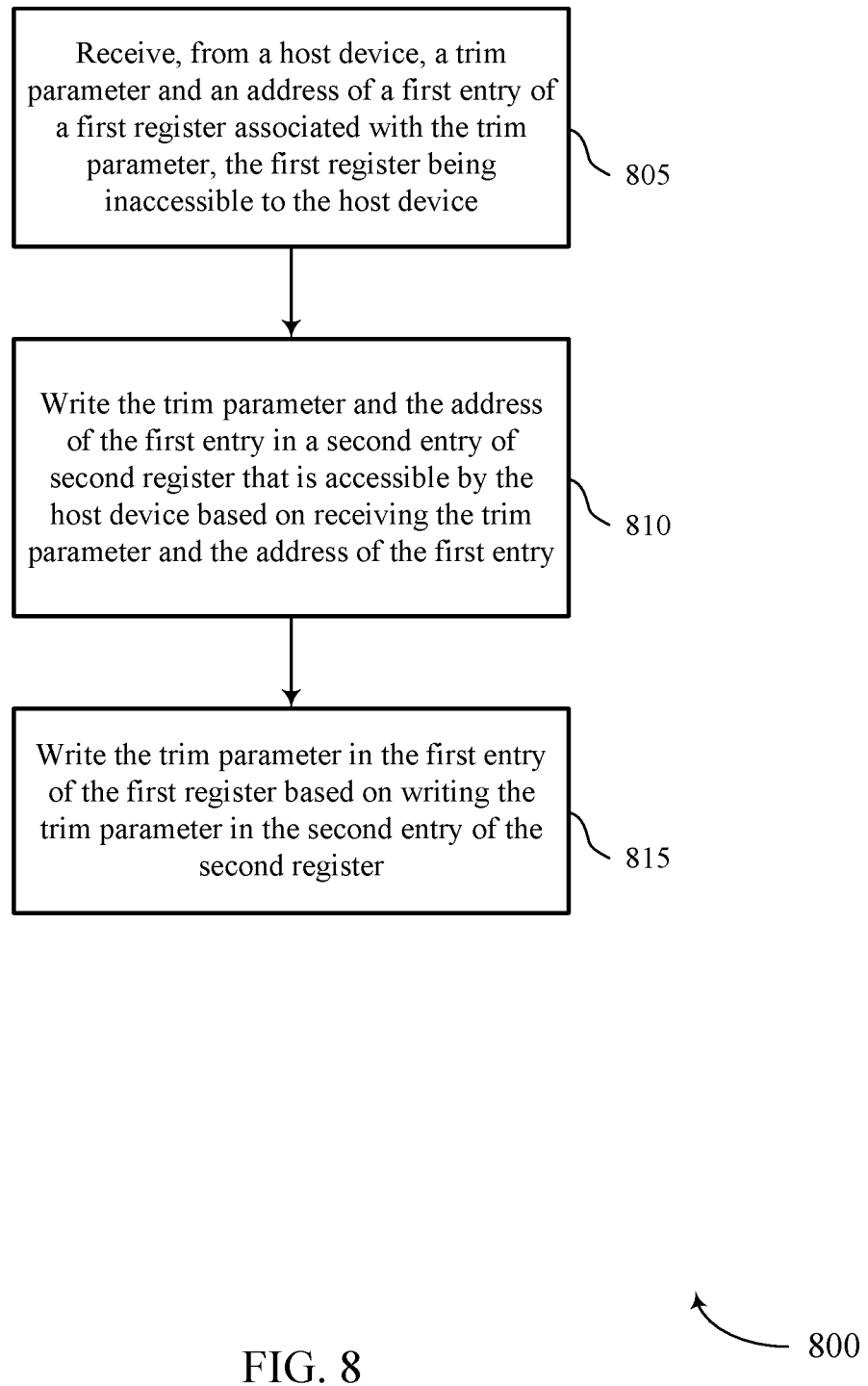

FIG. 8 shows a flowchart illustrating a method 800 for techniques to update a trim parameter in non-volatile memory in accordance with embodiments of the present disclosure. The operations of method 800 may be implemented by a memory device 120 or its components as described herein. For example, the operations of method 800 may be performed by the controller 140 or the memory controller 240, 330 as described with reference to FIGS. 1 through 3. In some embodiments, the memory device 120 may execute a set of codes to control the functional elements of the device to perform the functions described below. Additionally or alternatively, the memory device 120 may perform aspects of the functions described below using special-purpose hardware.

At block 805 the memory device 120 may receive, from a host device, a trim parameter and an address of a first entry of a first register associated with the trim parameter, the first register being inaccessible to the host device. In some cases, the memory device 120 may receive, from the host device, a read command or a write command associated with an address of a first entry of a first register associated with a trim parameter. The operations of 805 may be performed according to the methods described herein. In certain examples, aspects of the operations of 805 may be performed by an input/output component as described with reference to FIG. 5.

At block 810 the memory device 120 may write the trim parameter and the address of the first entry in a second entry of second register that is accessible by the host device based at least in part on receiving the trim parameter and the address of the first entry. The operations of 810 may be performed according to the methods described herein. In certain examples, aspects of the operations of 810 may be performed by a trim setting component as described with reference to FIG. 5.

At block 815 the memory device 120 may write the trim parameter in the first entry of the first register based at least in part on writing the trim parameter in the second entry of the second register. The operations of 815 may be performed according to the methods described herein. In certain examples, aspects of the operations of 815 may be performed by a trim setting component as described with reference to FIG. 5.

In some cases, the method 800 may also include determining that the host device is permitted to modify the trim parameter, wherein writing the trim parameter in the first entry is based at least in part on determining that the host device is permitted to modify the trim parameter. In some cases, the trim parameter comprises a type of the trim parameter or an operating condition of the trim parameter or both. In some cases, the method 800 may also include detecting a power-up event, wherein writing the trim parameter in the first entry of the first register is based at least in part on detecting the power-up event.

In some embodiments, an apparatus for techniques to update a trim parameter in non-volatile memory is described. The apparatus may include means for receiving, from a host device, a trim parameter and an address of a first entry of a first register associated with the trim parameter, the first register being inaccessible to the host device, means for writing the trim parameter and the address of the first entry in a second entry of second register that is accessible by the host device based at least in part on receiving the trim parameter and the address of the first entry, and means for writing the trim parameter in the first entry of the first register based at least in part on writing the trim parameter in the second entry of the second register.

In some cases, the apparatus may include means for determining that the host device is permitted to modify the trim parameter, wherein writing the trim parameter in the first entry is based at least in part on determining that the host device is permitted to modify the trim parameter. In some cases, the apparatus may include means for detecting a power-up event, wherein writing the trim parameter in the first entry of the first register is based at least in part on detecting the power-up event.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 120.

Chalcogenide materials may be materials or alloys that include at least one of the elements S, Se, and Te. Chalcogenide materials may include alloys of S, Se, Te, Ge, As, Al, Si, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including a memory device 200, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
identifying whether a mapping associated with a trim parameter is present in a translation register;
reading the trim parameter from a first entry of a first register inaccessible to a host device, a second entry of a second register accessible by the host device, or a third entry of a third register accessible by the host device based at least in part on identifying whether the mapping is present in the translation register; and
performing one or more operations at a memory array of a memory device in accordance with the trim parameter.

2. The method of claim 1, further comprising:
accessing the translation register that is inaccessible to the host device, wherein identifying whether the mapping associated with the trim parameter is present in the translation register is based at least in part on the accessing.

3. The method of claim 1, further comprising:
accessing the second register based at least in part on identifying a presence of the mapping associated with the trim parameter in the translation register, wherein the second entry of the second register indicates an updated value of the trim parameter.

4. The method of claim 3, wherein reading the trim parameter comprises:
reading the updated value of the trim parameter from the second entry of the second register based at least in part on accessing the second register; and
updating the first entry of the first register with the updated value of the trim parameter based at least in part on reading the updated value.

5. The method of claim 1, further comprising:
accessing the second register based at least in part on identifying a presence of the mapping associated with the trim parameter in the translation register, wherein the second entry of the second register fails to indicate an updated value of the trim parameter.

6. The method of claim 5, wherein reading the trim parameter comprises:
reading the trim parameter from the first entry of the first register based at least in part on accessing the second register.

7. The method of claim 1, further comprising:
accessing the third register based at least in part on identifying an absence of the mapping associated with the trim parameter in the translation register, wherein the third entry of the third register indicates an updated value of the trim parameter.

8. The method of claim 7, wherein reading the trim parameter comprises:
reading the updated value of the trim parameter from the third entry of the third register based at least in part on accessing the third register; and
updating the first entry of the first register with the updated value of the trim parameter based at least in part on reading the updated value.

9. The method of claim 1, further comprising:
accessing the third register based at least in part on identifying an absence of the mapping associated with the trim parameter in the translation register, wherein the third entry of the third register fails to indicate an updated value of the trim parameter.

10. The method of claim 9, wherein reading the trim parameter comprises:
reading the trim parameter from the first entry of the first register based at least in part on accessing the third register.

11. The method of claim 1, further comprising:
determining whether the trim parameter is modifiable by an update from the host device based at least in part on accessing the translation register.

12. The method of claim 1, further comprising:
accessing the third register and the second register, wherein reading the trim parameter is based at least in part on accessing the third register and the second register.

13. The method of claim 1, wherein the trim parameter comprises a type of the trim parameter or an operating condition of the trim parameter or both, and wherein reading the trim parameter is done without entering a test mode.

14. An apparatus, comprising:
a memory array comprising non-volatile memory cells; and
a controller associated with the memory array, the controller being operable to cause the apparatus to:
identify whether a mapping associated with a trim parameter is present in a translation register;
read the trim parameter from a first entry of a first register inaccessible to a host device, a second entry of a second register accessible by the host device, or a third entry of a third register accessible by the host device based at least in part on identifying whether the mapping is present in the translation register; and
perform one or more operations at the memory array of the apparatus in accordance with the trim parameter.

15. The apparatus of claim 14, wherein the controller is further operable to cause the apparatus to:
access the translation register that is inaccessible to the host device, wherein identifying whether the mapping associated with the trim parameter is present in the translation register is based at least in part on the accessing.

16. The apparatus of claim 14, wherein the controller is further operable to cause the apparatus to:
access the second register based at least in part on identifying a presence of the mapping associated with the trim parameter in the translation register, wherein the second entry of the second register indicates an updated value of the trim parameter.

17. The apparatus of claim 14, wherein the controller is further operable to cause the apparatus to:
access the second register based at least in part on identifying a presence of the mapping associated with the trim parameter in the translation register, wherein the second entry of the second register fails to indicate an updated value of the trim parameter.

18. The apparatus of claim 14, wherein the controller is further operable to cause the apparatus to:
access the third register based at least in part on identifying an absence of the mapping associated with the trim parameter in the translation register, wherein the third entry of the third register indicates an updated value of the trim parameter.

19. An apparatus, comprising:
a controller coupled with a host device via an interconnect;
a translation register coupled with the controller, the translation register inaccessible to the host device and operable to store a mapping associated with a trim parameter;
a first register inaccessible to the host device and operable to store the trim parameter;
a second register accessible to the host device and operable to store the trim parameter based at least in part on the mapping being present in the translation register; and
a third register accessible to the host device and operable to store the trim parameter based at least in part on the mapping being absent from the translation register.

20. The apparatus of claim 19, wherein the first register comprises a manufacturing setting register, the second register comprises a user space register, and the third register comprises a user-specified address register.

* * * * *